United States Patent
Tatah

(10) Patent No.: US 6,211,080 B1
(45) Date of Patent: Apr. 3, 2001

(54) REPAIR OF DIELECTRIC-COATED ELECTRODE OR CIRCUIT DEFECTS

(75) Inventor: Abdelkrim Tatah, Arlington, MA (US)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 08/741,480

(22) Filed: Oct. 30, 1996

(51) Int. Cl.$^7$ .................................................. H01L 21/44
(52) U.S. Cl. ........................... 438/680; 438/662; 438/798
(58) Field of Search .................................. 438/612, 640, 438/662, 680, 4, 98, 690, 761, 798; 427/469, 555, 597

(56) References Cited

U.S. PATENT DOCUMENTS

| | | |
|---|---|---|
| 3,560,258 | 2/1971 | Brisbane ............................... 117/212 |
| 4,349,583 | 9/1982 | Kulynych et al. ................... 427/53.1 |
| 4,432,855 | 2/1984 | Romankiw et al. ................. 204/207 |
| 4,622,058 | 11/1986 | Leary-Renick et al. ............... 65/105 |
| 4,704,304 * | 11/1987 | Amendola et al. ....................... 47/57 |
| 4,714,628 | 12/1987 | Eloy ....................................... 427/53.1 |
| 4,734,550 | 3/1988 | Imamura et al. ..................... 219/121 |
| 4,752,455 | 6/1988 | Mayer ................................... 427/53.1 |
| 4,758,388 | 7/1988 | Hamada et al. ......................... 264/25 |
| 4,832,798 | 5/1989 | Cvijanovich et al. ............... 205/209 |
| 4,880,959 | 11/1989 | Baum et al. ..................... 219/121.85 |
| 4,895,735 | 1/1990 | Cook ..................................... 427/43.1 |
| 4,933,204 | 6/1990 | Warren, Jr. et al. ................. 427/53.1 |
| 4,970,196 | 11/1990 | Kim et al. ................................ 505/1 |
| 4,987,006 | 1/1991 | Williams et al. .................... 427/53.1 |
| 4,987,007 | 1/1991 | Wagal et al. ......................... 427/53.1 |
| 5,057,184 | 10/1991 | Gupta et al. ........................... 156/637 |
| 5,079,070 | 1/1992 | Chalco et al. ......................... 428/209 |
| 5,153,408 | 10/1992 | Handford et al. ............... 219/121.64 |
| 5,164,565 | 11/1992 | Addiego et al. ................ 219/121.68 |
| 5,173,441 | 12/1992 | Yu et al. ................................. 437/173 |
| 5,175,504 | 12/1992 | Henley ................................... 324/501 |
| 5,203,929 | 4/1993 | Takayanagi et al. ................. 148/121 |
| 5,235,272 | 8/1993 | Henley ................................... 324/158 |
| 5,236,551 | 8/1993 | Pan ........................................ 156/643 |
| 5,246,745 | 9/1993 | Baum et al. .......................... 427/586 |
| 5,289,632 | 3/1994 | Chalco et al. ........................... 29/846 |
| 5,330,968 | 7/1994 | Nagaishi et al. ..................... 505/474 |
| 5,446,961 * | 9/1995 | Levite et al. ............................ 29/850 |
| 5,492,861 | 2/1996 | Opower ................................. 437/173 |
| 5,508,065 | 4/1996 | Weiner .................................. 427/552 |
| 5,567,336 * | 10/1996 | Tatah ............................... 219/121.66 |
| 5,814,165 * | 9/1998 | Tatah et al. ........................... 148/565 |
| 5,834,321 * | 12/1995 | Salisbury ................................. 438/4 |

FOREIGN PATENT DOCUMENTS 25 23 982    12/1976    (DE).
7099283      4/1995     (JP).

OTHER PUBLICATIONS

Tatah et al., Laser Ablation Forward Deposition of Metal Lines for Electrical Interconnect Repair, IEEE/CPMT Int'l Electronics Manufacturing Technology Symposium, 176–8 (1995).

* cited by examiner

Primary Examiner—David Nelms
Assistant Examiner—Renee' R. Berry
(74) Attorney, Agent, or Firm—Ratner & Prestia

(57) ABSTRACT

A method of repairing or augmenting a metal line buried beneath at least one cover layer comprising the steps of creating a via through the cover layer to the metal line, repairing or augmenting the metal line, and filling the via. Also provided is apparatus for repairing or augmenting a metal line buried beneath at least one cover layer comprising means for creating a via through the cover layer to the metal line, means for repairing or augmenting the metal line, and means for filling the via. Also provided is a substrate having a metal line buried beneath at least one cover layer wherein the metal line has been repaired or augmented according to the process comprising the steps of creating a via through the cover layer to the metal line, repairing or augmenting the metal line, and filling the via.

8 Claims, 6 Drawing Sheets

US 6,211,080 B1

REPAIR OF DIELECTRIC-COATED ELECTRODE OR CIRCUIT DEFECTS

FIELD OF THE INVENTION

This invention relates to repair of metal line and, more particularly, to the repair or augmentation of metal line covered with a dielectric material using laser ablation.

BACKGROUND OF THE INVENTION

Metal lines are commonly used for connecting circuits and personal computer boards and multichip modules, among many other applications. In some of these applications, the metal lines are covered by a dielectric material. In such devices, defects or openings in the metal line are difficult to repair because access to the metal lines is hindered by the dielectric cover layer. Presently, when defects in the metal lines of such devices are discovered, the device is considered irreparable, and it is thrown away.

A technique for repairing such buried metal lines is desirable. Such a technique would reduce production costs and waste of devices incorporating buried metal lines.

SUMMARY OF THE INVENTION

The present invention provides a method and apparatus for repairing or augmenting a metal line buried beneath at least one cover layer by creating a via through the cover layer to the metal line, repairing or augmenting the metal line, and filling the via.

The invention also provides a substrate having a metal line buried beneath at least one cover layer wherein the metal line has been repaired or augmented according to the process of creating a via through the cover layer to the metal line, repairing or augmenting the metal line, and filling the via.

DETAILED DESCRIPTION OF THE INVENTION

This invention provides a technique for repairing or augmenting an electrode or circuit, typically in the form of a metal line, when the electrode or circuit is buried beneath a layer of dielectric or other cover material.

Figure 1:
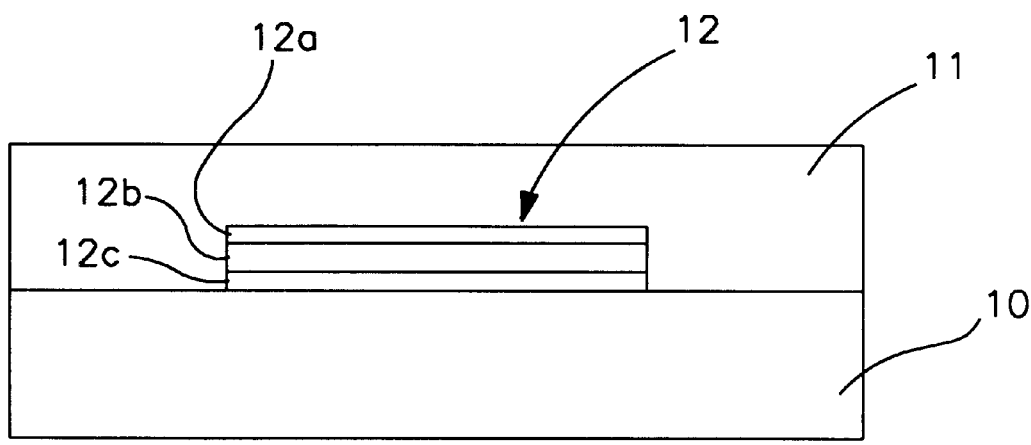
FIG. 1 is a side sectional view of a buried metal line, with an opening therein, on a substrate.

FIG. 1 is an exemplary depiction of such a device having a buried metal line. The device shown includes a substrate 10 which is typically soda lime glass. Metal line 12 is deposited on substrate 10. In the illustrated embodiment, metal line 12 comprises three separate layers, 12a, 12b, and 12c. Layers 12a and 12c are chromium, and layer 12b is copper. Disposed over metal line 12 and substrate 10 is a dielectric layer 11, which is $SiO_2$ in this embodiment and is about 20 microns thick. Dielectric layer 11 completely covers metal line 12 in the illustrated embodiment.

Figure 2:
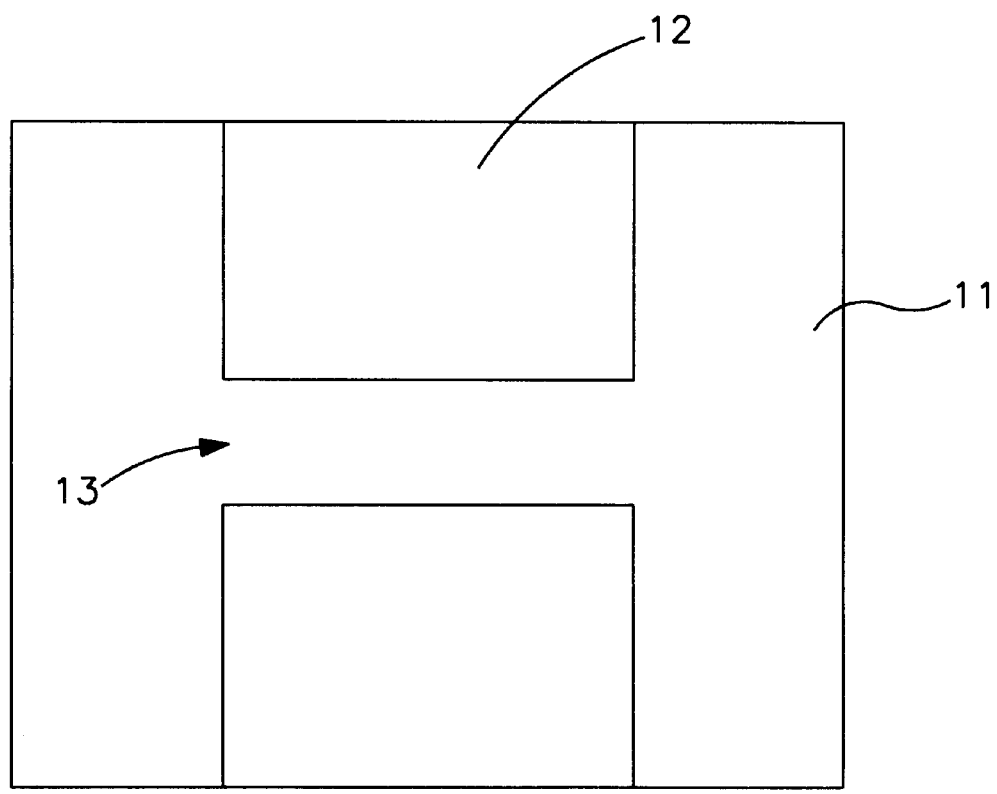
FIG. 2 is a top sectional view of the substrate shown in FIG. 1.

FIG. 2, which is a top sectional view of the device shown in FIG. 1, illustrates a defect, or opening, 13 in metal line 12. Such an opening 13 results in a break in electrical contact in the circuit which produces a defective device. Accordingly, it is desirable to repair opening 13 to reestablish contact between the separated portions of metal line 12. Before the present invention, devices with defects such as opening 13 depicted in FIG. 2 were merely discarded as unusable. With the present invention, however, it is possible to repair defects such as opening 13.

Figure 3:
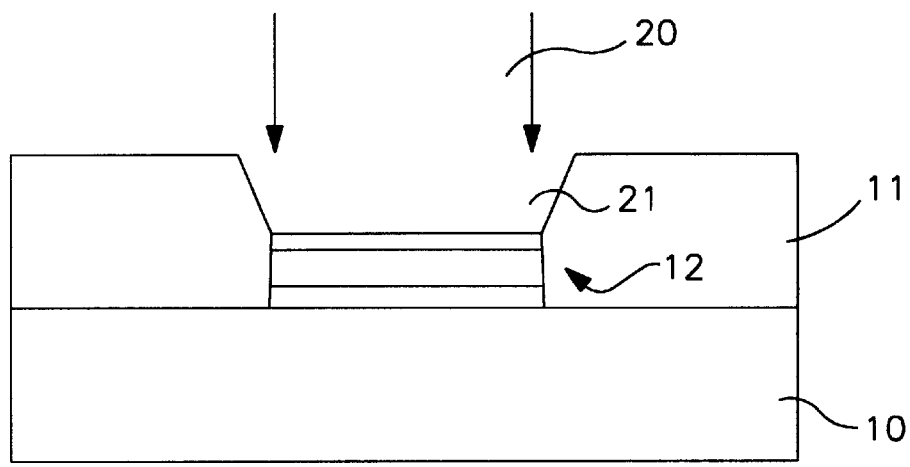
FIG. 3 is a side sectional view of the substrate depicted in FIG. 1 during repair according to an exemplary embodiment of the present invention.

In order to access metal line 12 to effect the repair, it is necessary to form a via 21 in dielectric layer 11 as shown in FIG. 3. Via 21 is formed by laser ablation. In the exemplary embodiment illustrated in FIG. 3, an ultraviolet laser beam 20 is directed onto dielectric layer 11 such that laser beam 20 impinges on dielectric layer 11 and ablates, or removes, ions from dielectric layer 11. As a result, an access, or via, 21 through dielectric layer 11 is produced. Via 21 may be formed in any desired shape or dimension. It is only necessary that via 21 provide access to opening 13 in metal line 12 to repair opening 13. Electrode 12 in the exemplary embodiment shown is approximately 60 microns wide. Via 21 is approximately 100 microns wide.

Figure 4:
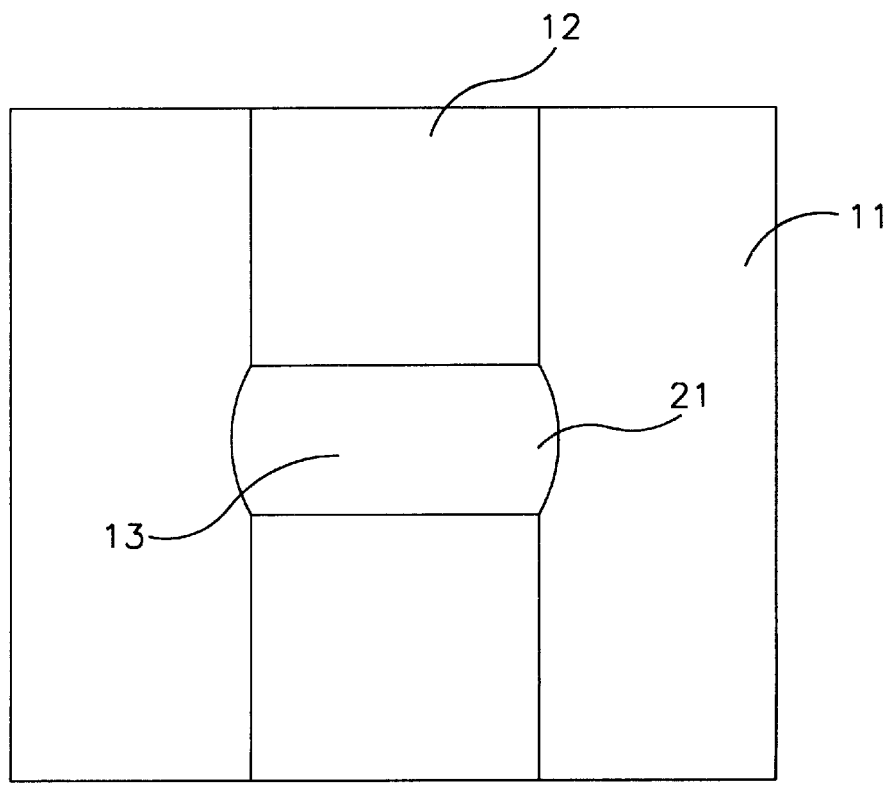
FIG. 4 is top sectional view of the substrate shown in FIG. 3.

FIG. 4 is a top view of the device shown in FIG. 3 with via 21 is formed in it. Via 21 in the illustrated embodiment is of a dimension sufficient to fully expose opening 13 in metal line 12.

Figure 5:
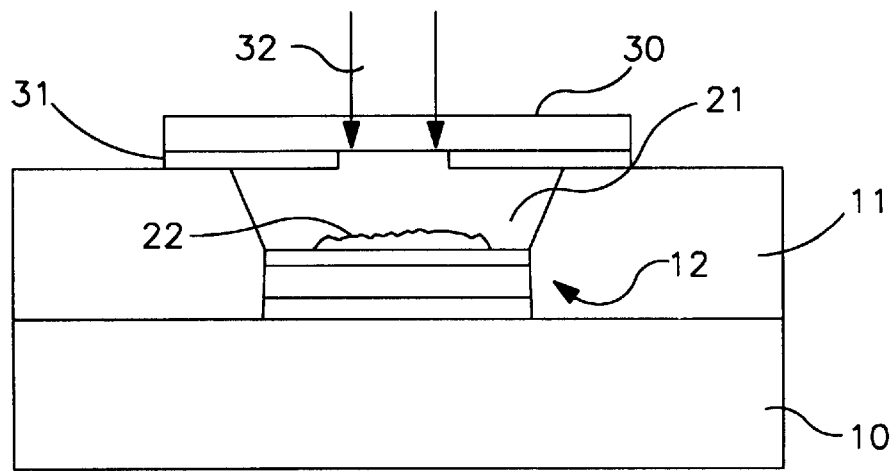
FIG. 5 is a side sectional view of the substrate shown in FIG. 1 during repair according to an exemplary embodiment of the present invention.

Once via 21 to metal line 12 is formed, opening 13 can be repaired. FIG. 5 shows a side sectional view of the deposition of metal into opening 13 to fill it and make the repair. Such deposition may be accomplished using conventional metal deposition techniques such as chemical vapor deposition, or by a technique involving laser ablation forward metal deposition. FIG. 5 is an exemplary illustration of such laser ablation forward metal deposition. Substrate 30 is provided with metal coating 31 on a first surface thereof and is disposed adjacent via 21. Laser beam 32, which in the illustrated embodiment is a green laser beam, is directed onto the side of substrate 30 opposite the side having metal coating 31 on it. Substrate 30 is transparent to laser beam 32 so that laser beam 32 passes through substrate 30 and impinges on metal coating 31. Metal ions from metal coating 31 are ablated from substrate 30 into opening 13. Laser beam 32 may be moved or scanned across substrate 30 as necessary to fill opening 13. Deposited metal 22 fills opening 13 and connects the separated portions of metal line 12 to reestablish electrical connection between these portions.

Figure 6:
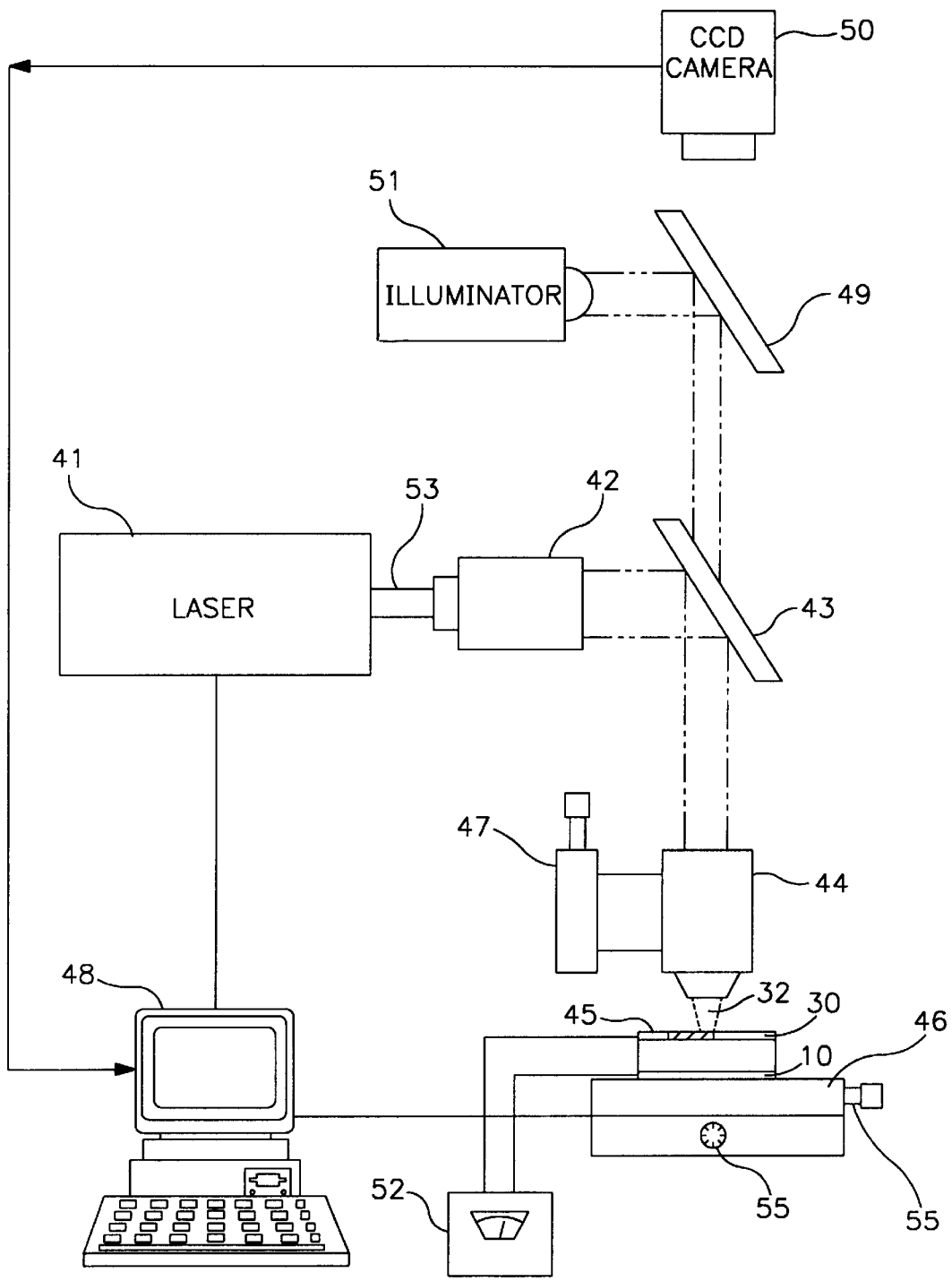
FIG. 6 is a side plan view of laser metal deposition apparatus including an exemplary embodiment of the present invention.

FIG. 6 illustrates a laser metal deposition apparatus suitable for depositing metal line into opening 13. In the exemplary embodiment shown in FIG. 6, laser 41 is a harmonically doubled solid state Q-switched Nd:YLF or Nd:YAG laser, available from Continuum Inc., in Santa Clara, Calif. Laser beam 53 from laser 41 is expanded by telescope 42 into expanded beam 54. Beam 54 shines on dichroic mirror 43 which directs beam 54 into objective lens 44. Objective lens 44 focuses the beam to a diffraction limit spot on sample 45, which may comprise, for example, the device shown in FIG. 5 including substrate 30 and substrate 10.

In the exemplary embodiment shown in FIG. 6, illuminator 51 provides light that is deflected by mirror 49 onto dichroic mirror 43. Illuminator 51 is used as a white light source to illuminate sample 45 so that the process and location of the focused spot can be monitored. A suitable illuminator is available from Edmund Scientific Company in Barrington, N.J.

Also, in the exemplary embodiment, CCD camera 50 is used to image and monitor the process location. The image is fed to computer 48 which computes subsequent process locations based on a programmed path. Any state of the art video camera is suitable for this purpose.

Sample 45 is supported on stage 46. Stage 46 is equipped with X-Y motion controls 55 that are controlled by computer 48. Suitable motion controls and computer are available from New England Affiliated Technologies in Lawrence, Mass., and comprise, for example, an XY-8080 precision stage, a PCX2 controller, and a 202M microstepping drive, with the controller interfaced to a 486 IBM PC or compatible.

Computer 48 also controls the power of laser 41. By adjusting the position of stage 46 and the power of laser 41, computer 48 enables the deposition of specific patterns on sample 45.

Figure 7:
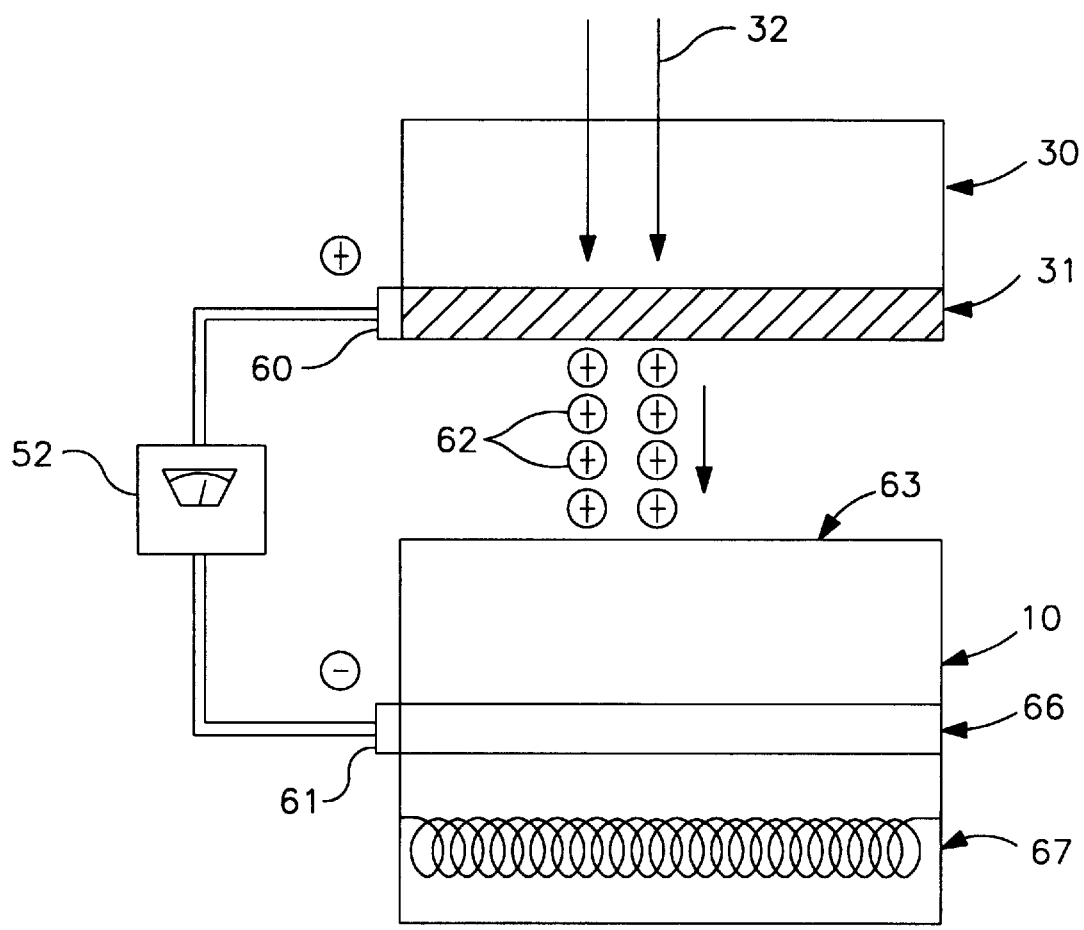
FIG. 7 is a side plan view of an exemplary unit cell for metal deposition and bonding according to the present invention.

Deposition of a metal line onto a substrate is illustrated in further detail in FIG. 7. A first substrate (corresponding to substrate 30 in FIG. 5 and thus illustrated with the same reference numeral), which is glass in the exemplary embodiment, is disposed in the path of focused laser beam 32. Glass substrate 30 has metal coating 31 disposed on the side of glass substrate 30 furthest from objective lens 44. Coating 31 may be deposited on substrate 30 by standard sputtering deposition or metal plating. Beam 32 passes through glass substrate 30 and impinges on metal coating 31 from the back side; that is, at the surface interface of metal coating 31 and glass substrate 30. The contact of laser 32 with metal coating 31 results in ablation of metal coating 31. During ablation, metal ions 62 accelerate away from metal coating 31.

A second substrate (corresponding to substrate 10 in FIG. 5 and thus illustrated with the same reference numeral), which is also glass in the exemplary embodiment, is disposed adjacent the side of first glass substrate 30 having metal coating 31 thereon. As metal ions 62 accelerate from glass substrate 30 as a result of the ablation caused by focused laser beam 32, metal ions 62 contact second glass substrate 10.

An electric field is applied across first glass substrate 30 and second glass substrate 10 using power supply 52. Power supply 52 is used to create the electric field in this embodiment. Power supply 52 has a positive electrode 60 attached to the initiated metallic line to insure a permanent chemical seal as discussed below. A negative electrode 61 is connected to second glass substrate 10. In the exemplary embodiment of the invention, the voltages applied across the electrodes are at least 300 volts.

The electric field drives positively charged metal ions 62 toward second glass substrate 10. The transfer of metal ions 62 from metal film 31 to surface 63 is due to the electrostatic force and laser ablation-generated acoustic shock waves.

The electric field applied across first glass substrate 30 and second glass substrate 10 also assists the bonding of metal ions 62 to second glass substrate 10. Because of the contact of the negative electrode with second glass substrate 10, the positive ions such as sodium ions in glass substrate 10 migrate away from surface 63 toward the negative electrode. This leaves behind negative ions such as oxygen in the glass substrate 10. These negative ions electrostatically bond with the positive metal ions that contact surface 63. A permanent chemical seal due to a thin metal oxide layer is formed after the electric field is removed. Conducting metal lines can thus be formed on surface 63 of second substrate 10 from metal ions 62.

A hot plate 67 may be used to augment the migration of positive ions within second glass substrate 10 to the negative electrode and thus enhance the bonding of metal ions 62 to surface 63 of second glass substrate 10. The heat increases the diffusion and allows for greater mobility of the ions in the glass.

Alternatively, electrode 61 may be connected directly to the metal line that is being deposited or repaired on substrate 10 (such as metal line 12). This helps channel ions 62 directly to the metal line.

Figure 8:
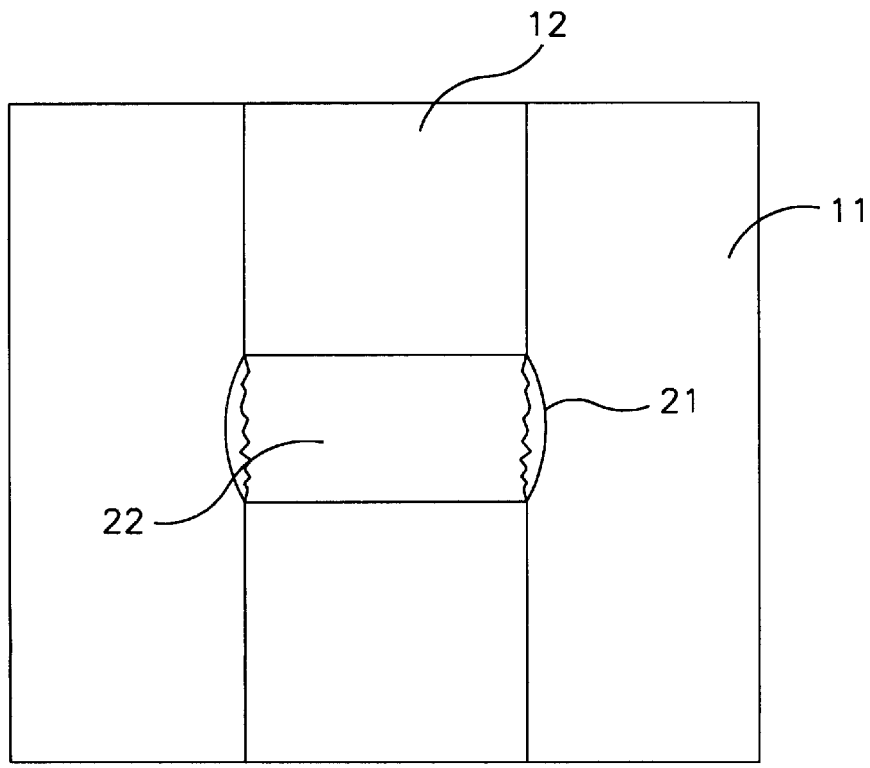
FIG. 8 is a top sectional view of the substrate shown in FIG. 5.

FIG. 8 shows a top sectional view of the exemplary device after deposit 22 is formed in opening 13. Via 21 should now be filled to complete repair of the device.

Figure 9:
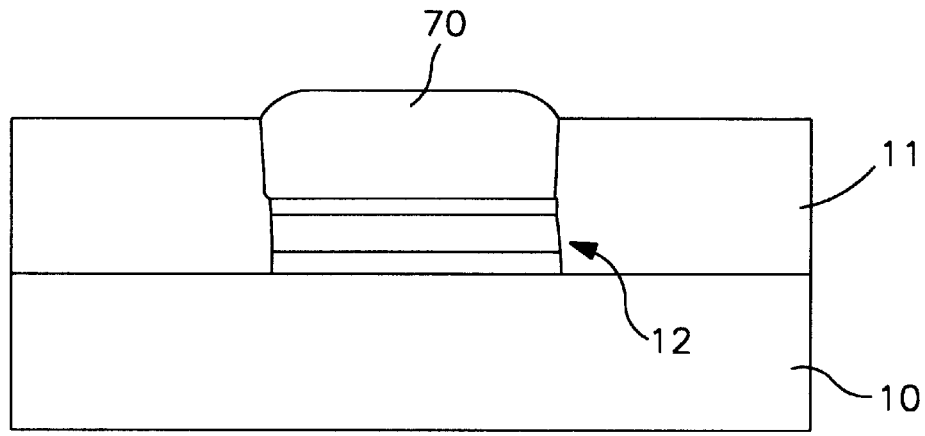
FIG. 9 is a side sectional view of the substrate shown in FIG. 1 during repair according to an exemplary embodiment of the present invention.

FIG. 9 illustrates this filling. Dielectric, or frit, filling 70 is formed in via 21 over repaired metal line 12. Frit 70 is typically glass powder. The powder may be dispensed by depositing it with a dispenser into via 21, or by screen printing over metal line 12, according to methods known to those skilled in the art. Frit 70 is then laser annealed to melt the frit and solidify it. The laser annealing can be accomplished using a high power laser diode emitting a beam that is focused onto frit 70. A laser diode or YAG laser may be focused on the frit to melt it and fuse it with dielectric layer 11. The laser should heat the frit to approximately 600° C. to accomplish the fusion. By way of illustration only, if a one watt ultraviolet laser is used and focused to a 50 micron waist, the laser need only be focused on the frit for about 3 to 5 seconds to accomplish the fusion.

Figure 10:
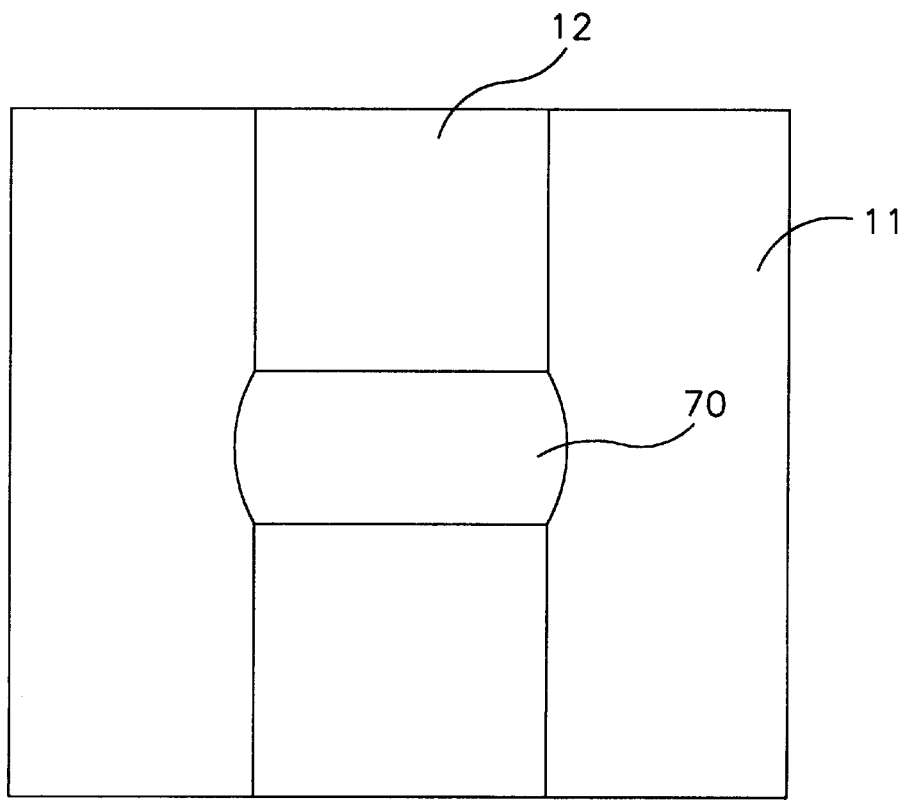
FIG. 10 is a top sectional view of the substrate shown in FIG. 9.

FIG. 10 is a top view of the device after deposition of frit 70 filling via 21 over metal line 12. The completed device is now ready for reuse in any application for which it was originally suited.

Repair of metal line according to the present invention provides an efficient, economical technique for preservation of electrode and circuit devices. Rather than having to discard the devices and manufacture entirely new ones, the same devices can be simply repaired and reused. This results in considerable savings in cost and materials.

Although this invention has been described with reference to particular embodiments, it is not intended to be limited thereto. Rather, the scope of the invention is intended to be interpreted according to this scope of the claims.

What is claimed:

1. A method of repairing or augmenting a defective segment of a metal line buried beneath at least one cover layer comprising the steps of:
    (a) creating a via through said cover layer to said metal line;
    (b) repairing or augmenting said metal line using laser ablation forward metal deposition to deposit a conductor within the via to restore the metal line in the defective segment; and
    (c) filling said via.

2. A method as defined in claim 1 wherein said step of creating a via through said cover layer is by laser ablation.

3. A method as defined in claim 2 wherein said step of creating a via by laser ablation comprises ablating said cover layer using an ultraviolet laser beam.

4. A method as defined in claim 1 wherein said step of repairing or augmenting said metal line by laser ablation forward metal deposition comprises the step of using a computer to control power and position of a laser.

5. A method as defined in claim 1 wherein step (a) comprises the step of selectively creating a via through said at least one cover layer to the defective segment of the metal line.

6. A method as defined in claim 1 wherein said step of filling said via comprises screen printing frit into said via.

7. A method as defined in claim 6 further comprising the step of laser annealing said frit.

8. A method of repairing or augmenting a defective segment of a metal line buried beneath at least one cover layer comprising the steps of:
    (a) creating a via through said cover layer to expose said defective segment of said metal line;
    (b) repairing or augmenting said defective segment of said metal line using laser ablation forward metal deposition to deposit a conductor within the via to restore the metal line in the defective segment; and
    (c) filling said via.

* * * * *